United States Patent
Martin et al.

(10) Patent No.: US 8,040,020 B2
(45) Date of Patent: Oct. 18, 2011

(54) ENCAPSULATED ACTIVE TRANSDUCER AND METHOD OF FABRICATING THE SAME

(75) Inventors: David Martin, Fort Collins, CO (US);
Osvaldo Buccafusca, Fort Collins, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/706,752

(22) Filed: Feb. 17, 2010

(65) Prior Publication Data

US 2011/0198970 A1    Aug. 18, 2011

(51) Int. Cl.
*H01L 41/09* (2006.01)
(52) U.S. Cl. .................................. 310/324; 310/328
(58) Field of Classification Search .............. 310/324, 310/340
See application file for complete search history.

(56) References Cited

U.S. PATENT DOCUMENTS

| 3,202,962 | A  | * | 8/1965  | Elston ........................ 367/160 |
| 6,204,593 | B1 | * | 3/2001  | Takahashi et al. ............ 310/353 |
| 6,659,954 | B2 |   | 12/2003 | Robinson |
| 6,747,400 | B2 | * | 6/2004  | Maichl et al. ................ 310/332 |
| 7,285,897 | B2 |   | 10/2007 | Fisher et al. |
| 7,456,709 | B2 | * | 11/2008 | Jung et al. .................... 333/187 |
| 7,589,452 | B2 | * | 9/2009  | Hauser et al. ............ 310/313 R |
| 7,589,453 | B2 | * | 9/2009  | Meister et al. ............ 310/313 R |
| 2005/0075572 | A1 |  | 4/2005 | Mills et al. |

FOREIGN PATENT DOCUMENTS

| WO | WO2008054395 A1 | 5/2008 |
| WO | WO2009073692 A1 | 6/2009 |

* cited by examiner

*Primary Examiner* — Thomas Dougherty

(57) ABSTRACT

A micro-electromechanical systems (MEMS) ultrasonic transducer device includes a substrate defining an opening and an active transducer having multiple of active layers stacked over the opening of the substrate. The active transducer is completely encapsulated by multiple passivation layers.

20 Claims, 9 Drawing Sheets

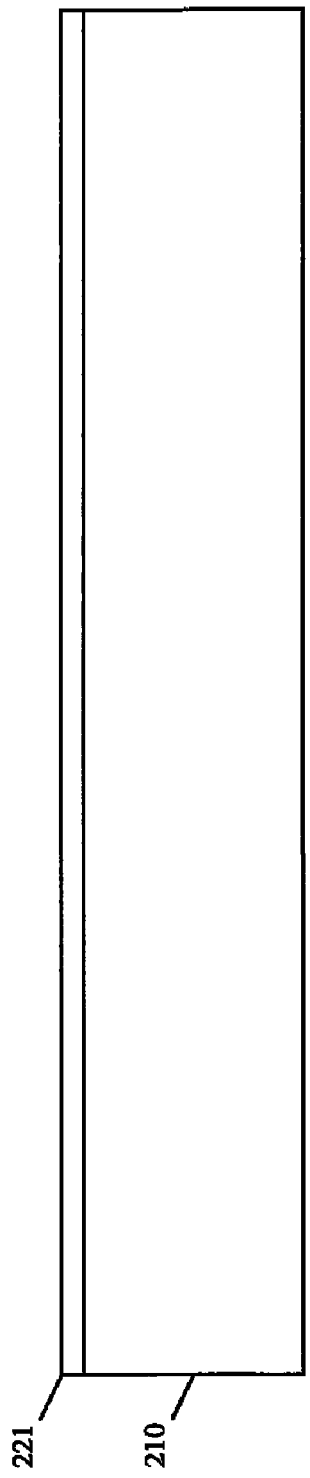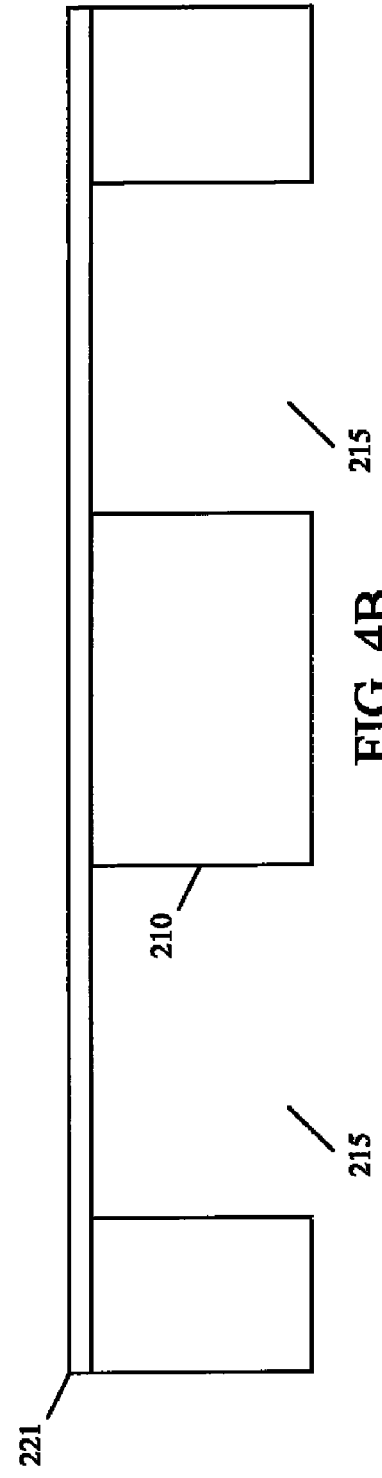
FIG. 4A
FIG. 4B

ENCAPSULATED ACTIVE TRANSDUCER AND METHOD OF FABRICATING THE SAME

BACKGROUND

Transducers generally convert electrical signals to mechanical signals or vibrations, and/or mechanical signals or vibrations to electrical signals. Acoustic transducers in particular convert electrical signal to acoustic signals (sound waves) in a transmit mode (e.g., a speaker application), and/or convert received acoustic waves to electrical signals in a receive mode (e.g., a microphone application). The functional relationship between the electrical and acoustic signals of an acoustic transducer depends, in part, on the transducer's operating parameters, such as natural or resonant frequency, acoustic receive sensitivity, acoustic transmit output power and the like.

Various types of transducers include micro-electromechanical systems (MEMS) transducers, such as piezoelectric micro-machined ultrasonic transducers (PMUTs), which are especially sensitive to operating environments. In order to provide some protection, a transducer may be passivated on top and bottom surfaces of the active transducer, in accordance with a simple passivation scheme.

For example, FIGS. 1A and 1B are cross-sectional diagrams illustrating a conventional transducer device.

Referring to FIG. 1A, transducer device 100 includes a substrate 110 with an opening 115, over which various layers are stacked to form an active transducer 150. More particularly, active layers of the transducer device 100 are formed between a first passivation layer 121 and a second passivation layer 122, which are stacked on the substrate 110. The active layers include a first conductive layer 131 formed on the first passivation layer 121, a piezoelectric layer 140 formed on the first conductive layer 131 and a second conductive layer 132 formed on the piezoelectric layer 140. The first and second conductive layers 131 and 132 act as first and second electrodes for the active transducer 150.

The first and second passivation layers 121 and 122 partially protect the active layers from moisture, corrosives, contaminants, debris and the like, but only with respect to the bottom (at opening 115) and top surfaces, respectively. In other words, the side surfaces or edges of the first and second conductive layers 131 and 132 and the piezoelectric layer 140 are exposed, having no passivation layer protection, e.g., after separation or dicing of the transducer device 100 from a wafer.

Accordingly, degradation due to exposure to the environment may occur in the active layers, for example, by channeling along the active layers through the exposed edges, as indicated by representative degraded portion 144 of the piezoelectric layer 140 in FIG. 1B. Such degradation compromises the integrity of the active layers, eventually causing the transducer device 100 to operate less efficiently and/or to malfunction, and otherwise shortening its operational life, particularly in harsh environments.

SUMMARY

In a representative embodiment, a micro-electromechanical systems (MEMS) ultrasonic transducer device includes a substrate defining an opening and an active transducer having multiple of active layers stacked over the opening of the substrate. The active transducer is completely encapsulated by multiple passivation layers.

In another representative embodiment, a piezoelectric micro-machined ultrasonic transducer (PMUT) device includes a first passivation layer formed on a substrate, a first electrode formed on the first passivation layer, a piezoelectric layer formed on the first electrode, and a second electrode formed on the piezoelectric layer. A channel surrounds an active area of the PMUT device, the channel being etched through the first electrode, the piezoelectric layer and the second electrode to the first passivation layer, and exposing corresponding edges of the first electrode, the piezoelectric layer and the second electrode and a portion of the first passivation layer. A second passivation layer is formed on the second electrode and the channel, the second passivation layer conformally coating the exposed edges of the first electrode, the piezoelectric layer and the second electrode, and the exposed portion of the first passivation layer in the channel to encapsulate the active area of the PMUT device.

In another representative embodiment, a method of fabricating a MEMS ultrasonic transducer device includes forming a first passivation layer on a wafer; forming an active transducer including multiple active layers on the first passivation layer; forming a photoresist pattern on the active transducer; etching a channel through the active layers using the photoresist pattern, the channel completely surrounding the active transducer; removing the photoresist pattern; and forming a second passivation layer on the active transducer and the channel. The second passivation layer covers a top surface of the active transducer and exposed side surfaces of the active layers, so that the active transducer is encapsulated by the first and second passivation layers.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIGS. 4A-4G are cross-sectional diagrams illustrating steps in a fabrication process of a transducer device, according to a representative embodiment.

DETAILED DESCRIPTION

Figure 1A:
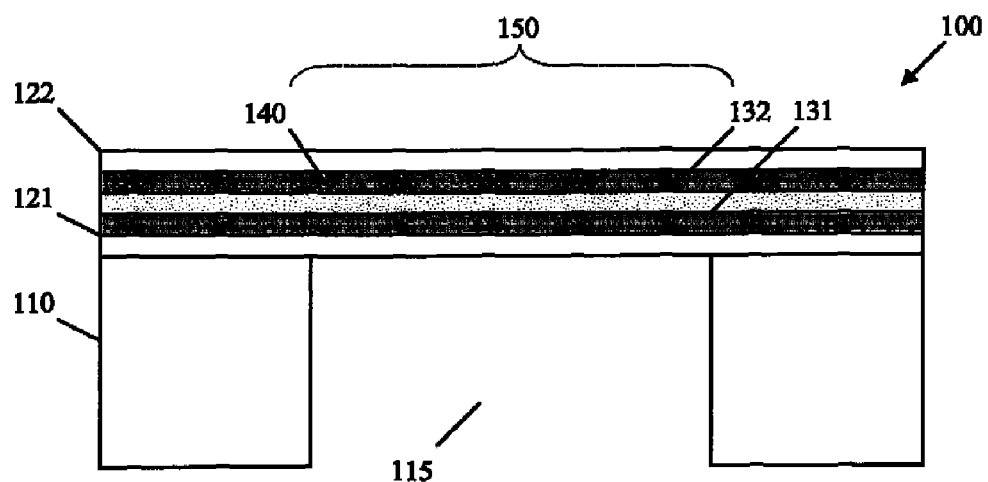
FIGS. 1A and 1B are cross-sectional diagrams illustrating a conventional transducer device.
Figure 1B:
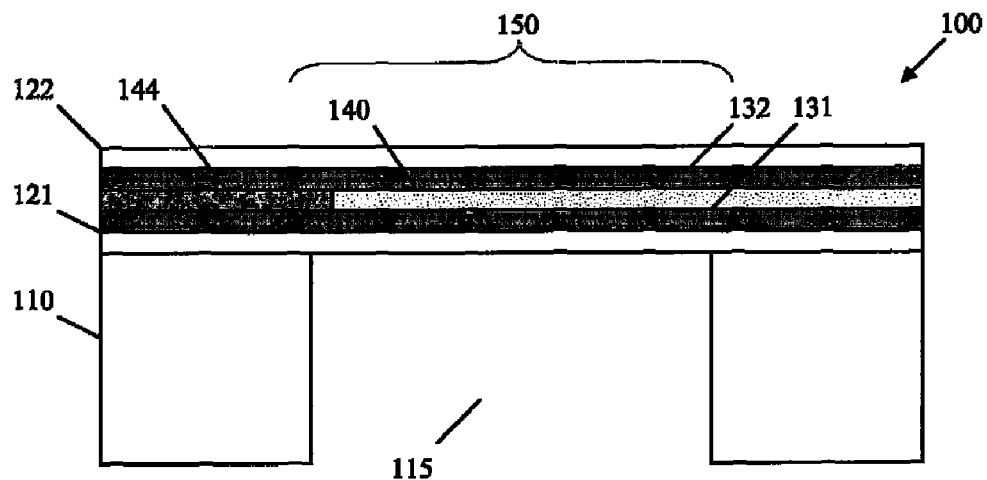

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

According to various embodiments, a transducer device, such as a MEMS acoustic transducer or a PMUT, includes an active transducer on a substrate, where the active transducer includes active layers encapsulated by passivation layer material. For example, the transducer device may be formed on a first passivation layer and include a guard band or a channel etched around an outer perimeter of the active transducer, such that a second passivation layer applied to the active transducer and the channel, together with the first passivation layer, completely surrounds the active transducer, providing protection to top, bottom and side surfaces of the active layers. Thus, the sensitive active layers of the transducer device are completely isolated from the operating environment.

Figure 2A:
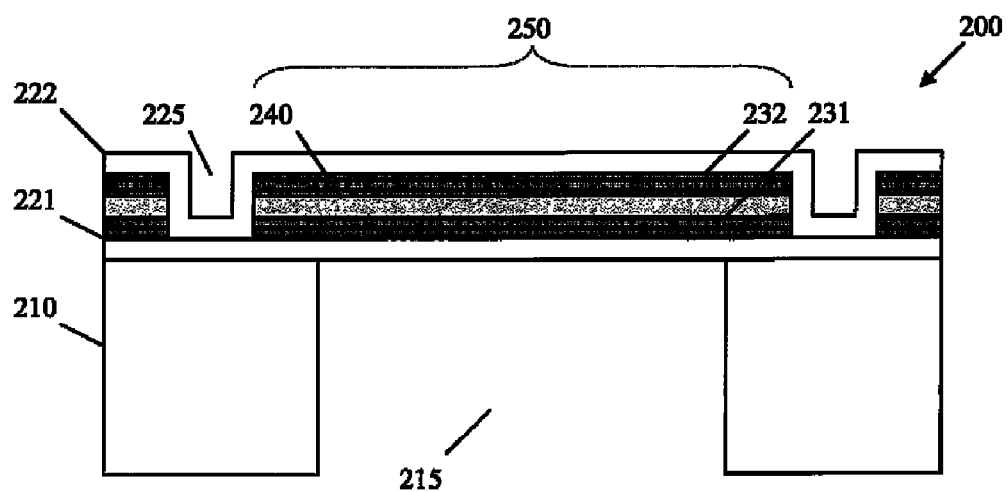
FIG. 2A is a cross-sectional diagram illustrating a transducer device, according to a representative embodiment.
Figure 2B:
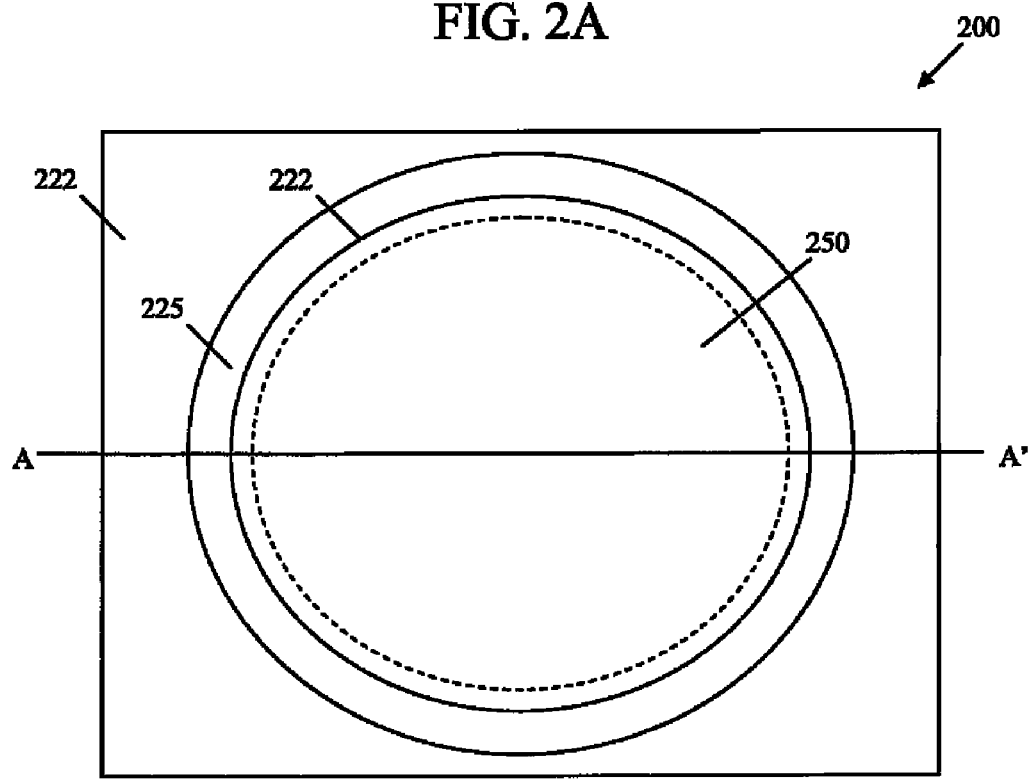
FIG. 2B is as top plan view illustrating a transducer device, according to a representative embodiment.

FIGS. 2A and 2B are cross-sectional and top plan views illustrating a transducer device, respectively, which includes an encapsulated active portion, according to a representative embodiment. More particularly, FIG. 2A is a cross-sectional view illustrating the transducer device depicted in FIG. 2B, taken along line A-A', according to a representative embodiment.

Referring to FIGS. 2A and 2B, transducer device 200 includes a passivation encapsulated active transducer 250 positioned on a substrate 210 over opening 215. The transducer device 200 is depicted as a singulated die, e.g., after separation from a wafer, although the transducer device 200 may be included in a packaged device and/or an array of similarly configured transducers. In the depicted embodiment, the active transducer 250 is substantially circular in shape, as shown in FIG. 2B, and is surrounded by an annular passivation guard band or passivation channel 225, which extends through the layers of the active transducer 250. In alternative embodiments, the active transducer 250 and/or the passivation channel 225 may be formed in different shapes, such as ovals, squares, rectangles and the like, without departing from the scope of the present teachings.

More particularly, as shown in FIG. 2A, the substrate 210 includes the opening 215, which enables the mechanical movement of the exposed portion of the encapsulated active transducer 250. The substrate 210 may be formed of various types of semiconductor materials compatible with semiconductor processes, such as silicon (Si), gallium arsenide (GaAs), indium phosphide (InP), or the like, which is useful for integrating connections and electronics, thus reducing size and cost. In various embodiments, the substrate 210 may include an insulating material, such as glass, sapphire, alumina or the like. The opening 215 in the bottom surface of the substrate 210 is substantially circular, although it may have any of a variety of sizes and shapes, such as oval, square, rectangular and the like, without departing from the scope of the present teachings. The opening 215 may be obtained by back side etching the bottom surface of the substrate 210, which may include a dry etch process, such as a Bosch process, for example, although various alternative techniques may be incorporated without departing from the scope of the present teachings.

A first passivation layer 221 is located on the top surface of the substrate 210. The first passivation layer 221 may be formed of various types of materials compatible with semiconductor processes, including boron silicate glass (BSG), silicon dioxide ($SiO_2$), silicon nitride (SiN), polysilicon, or the like. In various embodiments, the first passivation layer 221 may include multiple layers of the same or different materials. For example, the first passivation layer 221 may include a layer of $SiO_2$ stacked on a layer of SiN. The portion of the first passivation layer 221 within the inner perimeter of the passivation channel 225 forms the bottom of the encapsulation of the active transducer 250.

The total thickness of the first passivation layer 221 must be sufficient to insulate subsequently formed layers of the active transducer 250 from the environment, including protection from moisture, corrosives, contaminants, debris, and the like, to which the active transducer 250 would otherwise be exposed through the opening 215. For example, the first passivation layer 221 may be about 0.05 μm to about 10 μm thick, although the thickness may vary to provide unique benefits for any particular situation or to meet application specific design requirements of various implementations, as would be apparent to one skilled in the art. In an embodiment, a gas permeable screen or mesh (not shown) may additionally cover the opening 215 in order to provide additional protection of the internal components. The screen or mesh may include multiple apertures sufficiently large to allow exposure to the ambient environment, yet small enough to limit the amount of contaminates that can enter the opening 215.

The active layers of the active transducer 250 are stacked on the top surface of the first passivation layer 221. The active layers include a first electrode 231 on the first passivation layer 221, a piezoelectric layer 240 on the first electrode 231 and a second electrode 232 on the piezoelectric layer 240. The portion of the active layers situated over the opening 215 substantially forms the active area of the transducer device 200.

The first and second electrodes 231 and 232 are formed of an electrically conductive material, such as molybdenum (Mo), tungsten (W), aluminum (Al), or the like. The first and second electrodes 231 and 232 are electrically connected to external circuitry via contact pads (not shown), which may be formed of a conductive material, such as gold, gold-tin alloy or the like. The thicknesses of the electrodes may range from about 0.05 μm to about 10 μm, for example, although the thickness may vary to provide unique benefits for any particular situation or to meet application specific design requirements of various implementations, as would be apparent to one skilled in the art.

The piezoelectric layer 240 is formed of a thin film of aluminum nitride (AlN), zinc oxide (ZnI), or other film compatible with semiconductor processes. The thickness of the piezoelectric layer may range from about 0.1 μm to about 10 μm, for example, although the thickness may vary to provide unique benefits for any particular situation or to meet application specific design requirements of various implementations, as would be apparent to one skilled in the art.

A second passivation layer 222 is formed on the top and side surfaces of the active layers of the active transducer 250, and an exposed portion of the top surface of the first passivation layer 221. More particularly, the passivation layer 222 covers the top surface of the second electrode 232, the exposed side surfaces of the second electrode 232, the piezoelectric layer 240 and the first electrode 231, and the portion of the first passivation layer exposed at the bottom of the passivation channel 225.

The second passivation layer 222 may be formed of various types of materials compatible with semiconductor processes, including BSG, $SiO_2$, SiN, polysilicon, or the like, and may include multiple layers of the same or different materials. The total thickness of the second passivation layer 222 also must be sufficient to insulate all layers of the active transducer 250 from the environment, including protection from moisture, corrosives, contaminants, debris and the like, to which the active transducer 250 would otherwise be exposed. For example, the second passivation layer 222 may be about 0.05 μm to about 1.0 μm thick, although the thickness may vary to provide unique benefits for any particular situation or to meet application specific design requirements of various implementations, as would be apparent to one skilled in the art. In various alternative embodiments, the second passivation layer 222 may be formed as a molecular vapor deposition (MVD) film, resulting in a thin layer (e.g., about 50 Å to about 500 Å) of passivation material, such as alumina, for example.

In an embodiment, the second passivation layer 222 is formed of the same material(s) and/or has the same thickness as the first passivation layer 221. However, the first and second passivation layers 221 and 222 may be formed of different materials and/or have different thickness, without departing from the scope of the present teachings.

Generally, in a transmit mode, an electrical input signal (e.g., excitation signal) may be input to the first and/or second electrodes 231 and 232, via corresponding contact pads, and converted to a mechanical vibration (or resonance) having a frequency induced by the piezoelectric layer 240. In a receive mode, an acoustic input signal may be input to the piezoelectric layer 240, e.g., through the opening 215, and converted to a corresponding electrical output signal output by the first and/or second electrodes 231 and/or 232, via the contact pads.

As stated above, the transducer device 200 may be an ultrasonic transducer fabricated using MEMS technology. When the transducer device 200 is a PMUT, for example, the translation is made through a piezoelectric material, e.g., by the piezoelectric layer 240. In various embodiments, the transducer device 200 may be a capacitive micro-machined ultrasonic transducer (CMUT), in which case the translation is made through a capacitance variation. It is understood that other types and arrangements of membranes and/or transducer structures may be incorporated in the transducer device 200, without departing from the scope of the present teachings.

According to various embodiments, the transducer device 200 may be fabricated using various techniques compatible with semiconductor processes. A non-limiting example of a fabrication process directed to representative transducer device 200 is discussed below with reference to FIGS. 3 and 4A-4G.

Figure 3:
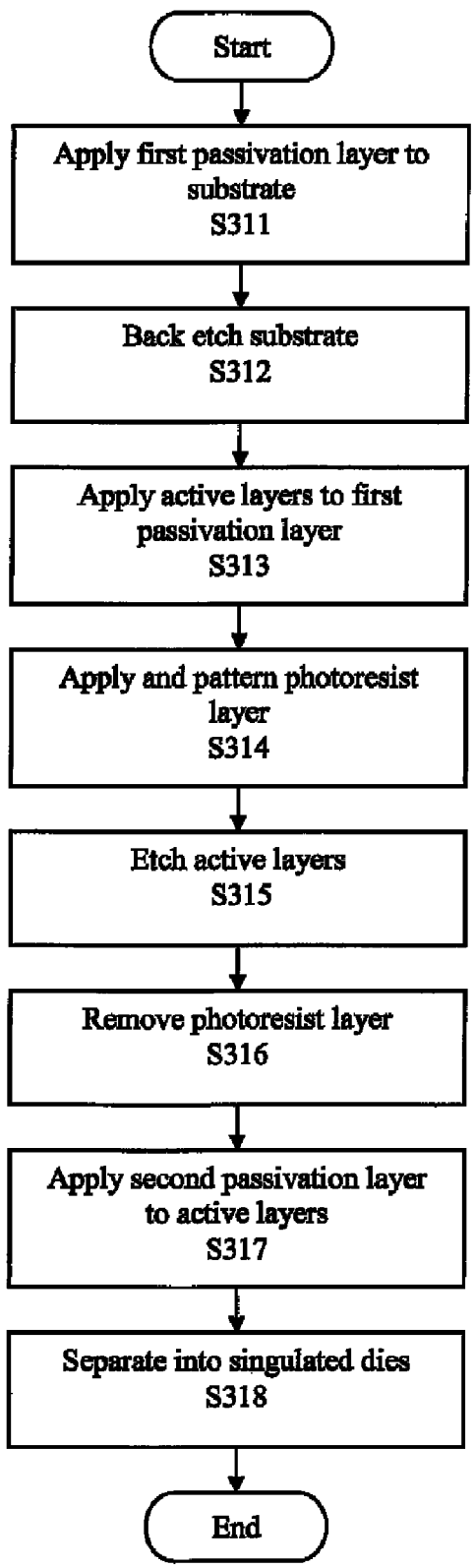
FIG. 3 is a flow diagram illustrating a method of fabricating a transducer device, according to a representative embodiment.

FIG. 3 is a flow diagram illustrating a method of fabricating a transducer device, according to a representative embodiment. FIGS. 4A-4G are cross-sectional diagrams illustrating the steps of the fabrication process of a transducer device, substantially corresponding to the operations depicted in FIG. 3, according to a representative embodiment.

In step S311 of FIG. 3, the first passivation layer 221 is applied to the substrate 210, as shown in FIG. 4A. In an embodiment, the first passivation layer 221 is a single layer of BSG and the substrate 210 is a silicon semiconductor substrate, for example. However, the first passivation layer 221 may be formed from other materials (e.g., $SiO_2$, SiN, polysilicon, etc.) and/or by multiple layers, and the substrate 210 may likewise be formed from other materials (e.g., GaAs, InP, etc.), without departing from the scope of the present teachings. The first passivation layer 221 may be applied using spin-on, sputtering, evaporation or chemical vapor deposition (CVD) techniques, for example, although other application methods may be incorporated. In FIG. 4A, the substrate 210 is depicted in wafer form, such that multiple dies corresponding to transducer devices (e.g., each of which would be the same as transducer device 200) may be formed simultaneously during the fabrication process, and separated or singulated upon completion, as discussed below with reference to block S318.

Back side etching is performed on a bottom surface of the substrate 210 in block S312 to form openings 215, which will correspond to the transducer devices 200, as shown in FIG. 4B. The back side etch may include using a dry etch process, such as a Bosch process, for example, although various alternative techniques may be incorporated without departing from the scope of the present teachings. The bottom surface of the first passivation layer 221 is used as an etch stop. Although depicted as the second step in the representative fabrication process, the back side etching may be performed at any time prior to singulating the dies, according to various embodiments. Also, although the openings 215 are shown as having substantially parallel side walls, it is understood that various embodiments may include side walls of any shape, such as tapered side walls to provide substantially conical shaped openings 215.

Active layers are applied to the first passivation layer 221 in block S313. The active layers include sequentially stacked first conductive layer 231', piezoelectric layer 240' and second conductive layer 232'. In an embodiment, the first and second conductive layers 231' and 232' are formed from Mo and the piezoelectric layer is formed from AlN. However, the first and second conductive layers 231' and 232' may be formed from other materials (e.g., W, Al, etc.), and/or the piezoelectric layer may be formed from other materials (e.g., ZnO, etc.), without departing from the scope of the present teachings. The piezoelectric layer 240' may be formed using a sputtering technique, and the first and second conductive layers 231', 232' may be formed using a sputtering technique, for example, although other application techniques may be incorporated.

Figure 4C:
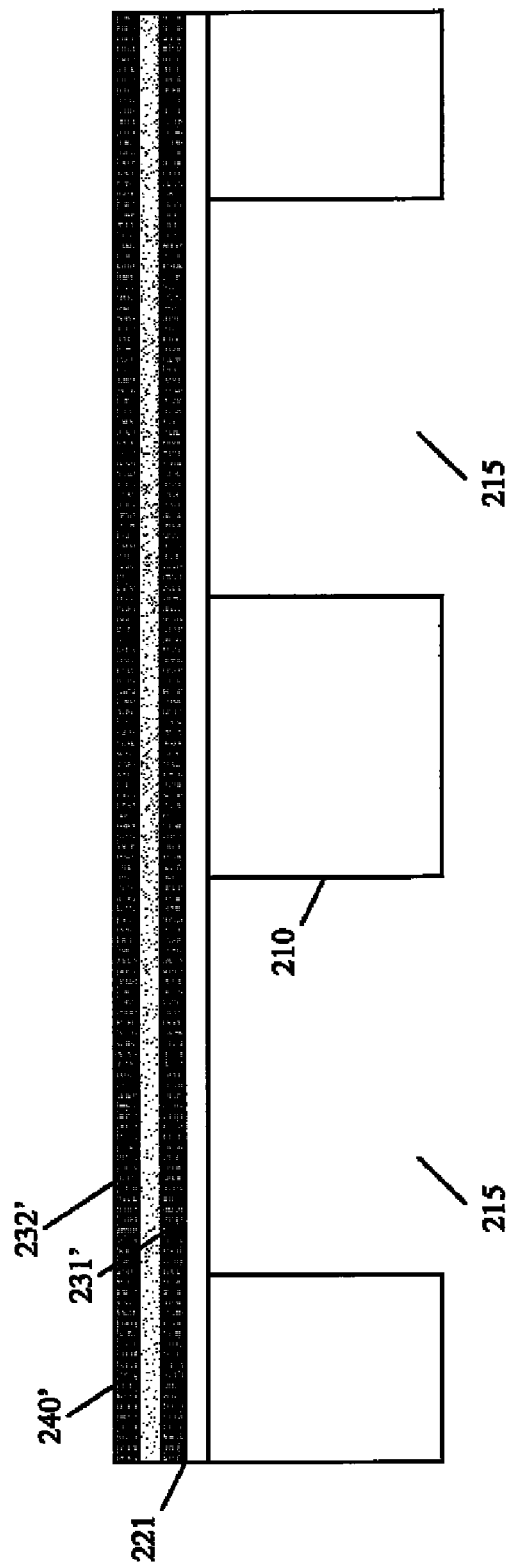
Figure 4D:
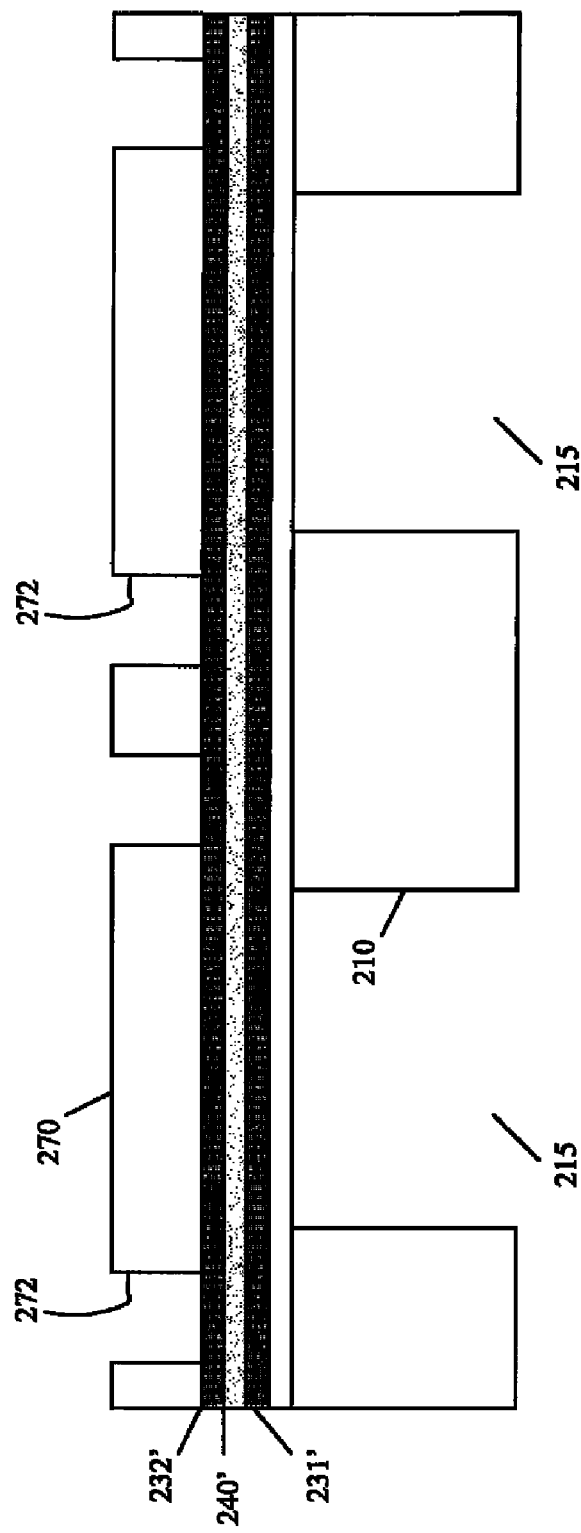

In block S314, a photoresist layer is applied to the top surface of the second conductive layer 232', and patterned to form mask or photoresist pattern 270, as shown in FIG. 4D. The photoresist pattern 270 may be formed using any phostoresist compatible with semiconductor processes, as would be apparent to one of ordinary skill in the art. The photoresist pattern 270 may be formed by machining or by chemically etching the photoresist layer using photolithography, although various alternative techniques may be incorporated. The photoresist pattern 270 includes channel openings 272.

Figure 4E:
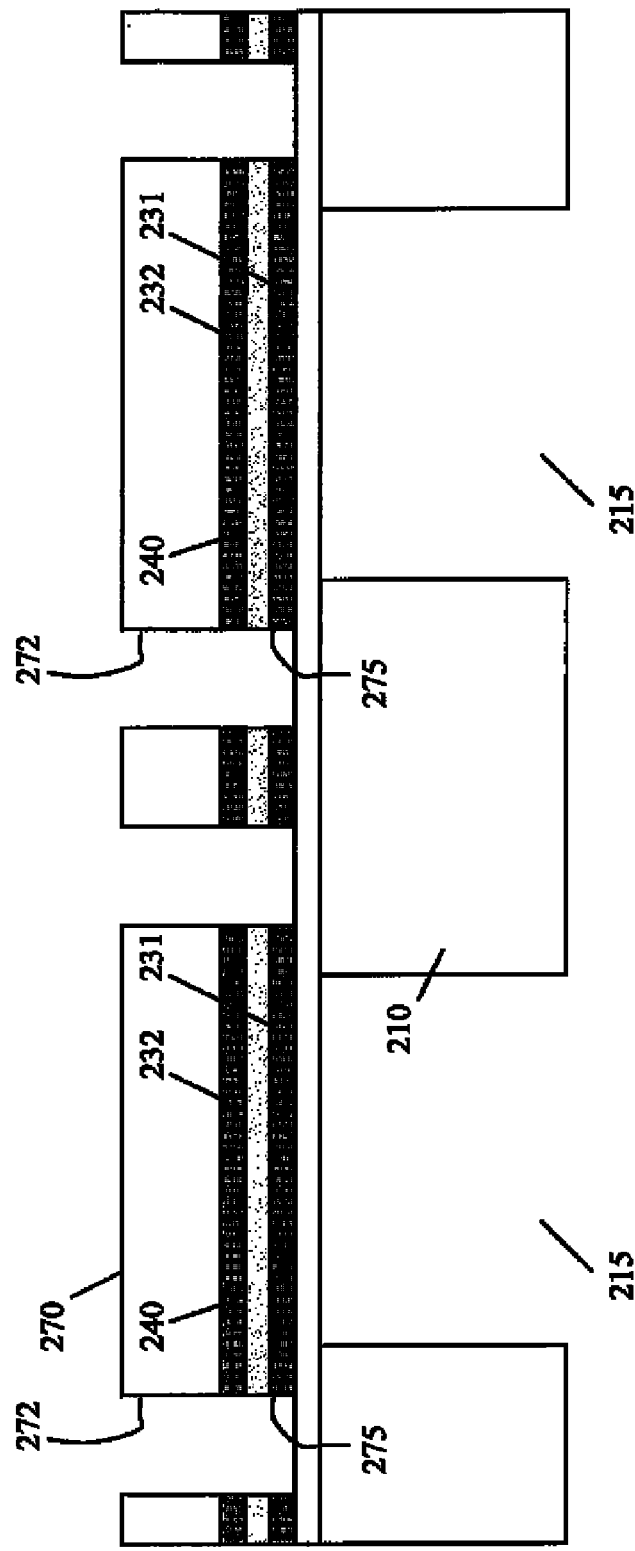
Figure 4F:
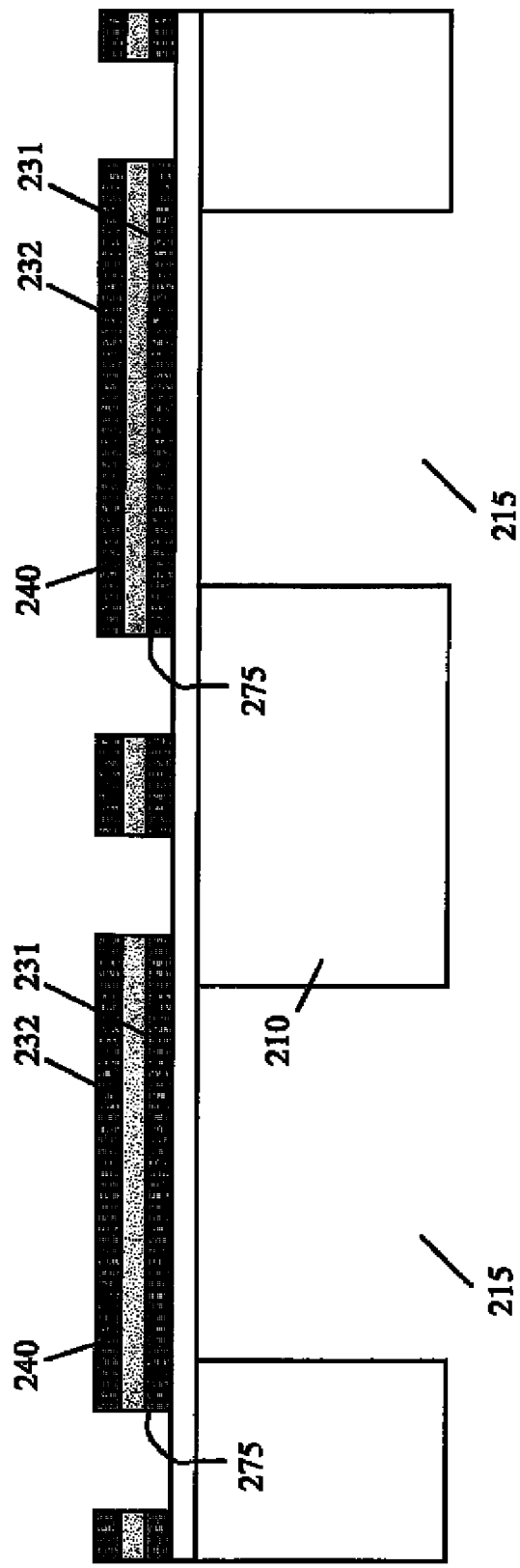

The active layers, including first conductive layer 231', piezoelectric layer 240' and second conductive layer 232', are etched through the channel openings 272 of the photoresist pattern 270 to form corresponding channels 275 in block S315, as shown in FIG. 4E. The top surface of the first passivation layer 221 is used as an etch stop. The channels 275 may be substantially circular (e.g., as shown in FIG. 2B, above), and completely or partially surround each active transducer (e.g., active transducer 250), as discussed below. The channels 275 thus provide the first electrode 231, the piezoelectric layer 240 and second electrode 232.

The channels 275 may have a number of alternative configurations, according to various embodiments. For example, the channels 275 may have any of a variety of shapes, such as such as ovals, squares, rectangles, and the like. Also, the channels 275 may traverse the perimeter of each die, which may be larger than the respective active areas of the corresponding transducer structures, or the channels 275 may closely surround the respective active areas, substantially defining the same.

The photoresist pattern 270 is removed in block S316, as shown in FIG. 4E. For example, the photoresist pattern 270 may be chemically released or etched, for example, using a wet etch process including HF etch solution, for example, although the photoresist pattern 270 may be removed by various other techniques, without departing from the scope of the present teachings.

Figure 4G:
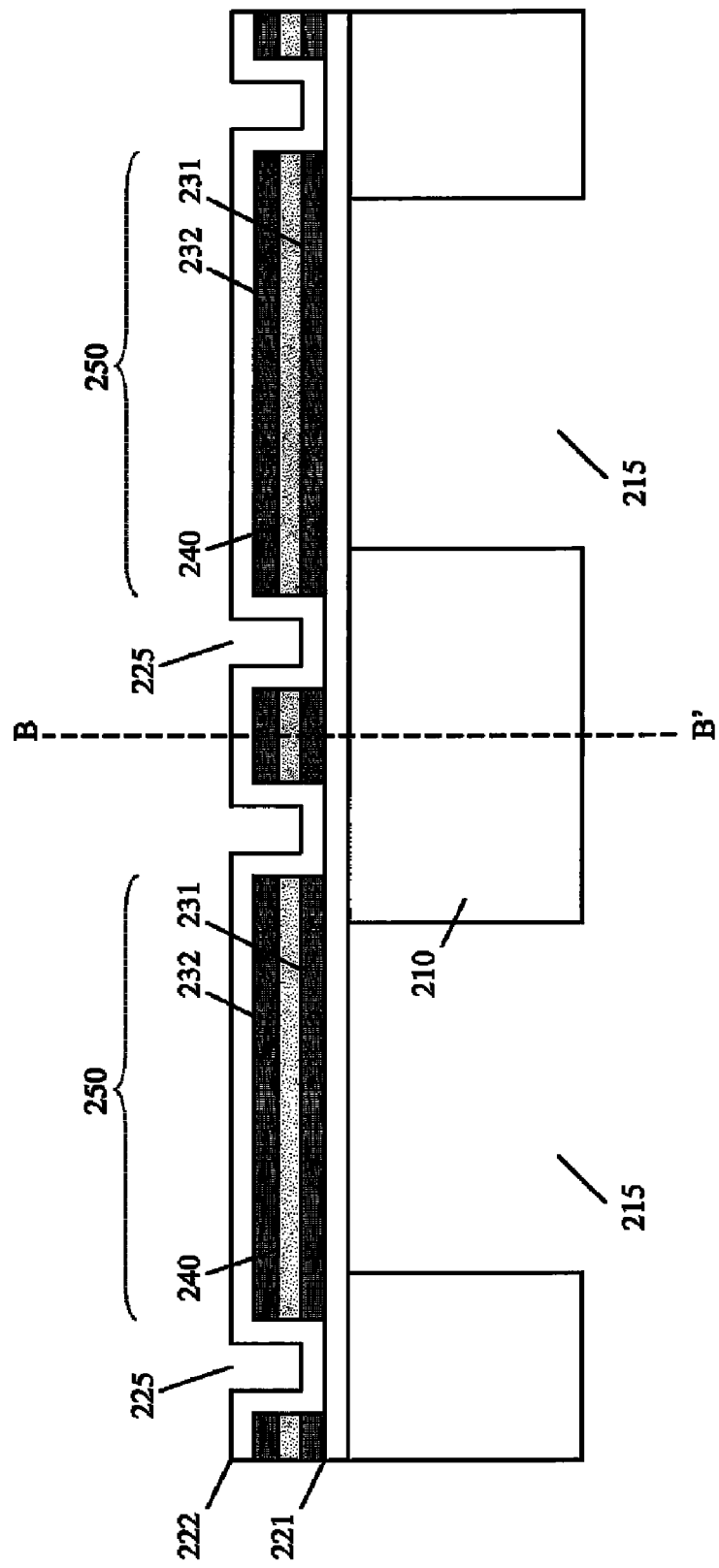

In block S317, the second passivation layer 222 is applied to the exposed top and side surfaces of the active layers, including the first electrode 231, the piezoelectric layer 240 and the second electrode 232, as shown in FIG. 4G. In other words, the second passivation layer 222 conformably coats the exposed surfaces. The second passivation layer 221 may be applied using spin-on, sputtering, evaporation or CVD techniques, for example, although other application methods may be incorporated without departing from the scope of the present teachings. The second passivation layer 222 thus completes the encapsulation of each active transducer 250, including the first electrode 231, the piezoelectric layer 240 and the second electrode 232. In an embodiment, the second passivation layer 222 is a single layer of BSG, for example, although the second passivation layer 222 may be formed from other materials (e.g., $SiO_2$, SiN, polysilicon, etc.), and/or by multiple layers, without departing from the scope of the present teachings. In various alternative embodiments, the second passivation layer 222 may be formed as an MVD film, resulting in a thin layer (e.g., about 50 Å to about 500 Å) of passivation material, such as alumina, for example.

Adjacent active transducers 250 are then cut or separated from the wafer in block S318, for example, along line B-B', to form singulated dies, such as active transducer 250 depicted in FIGS. 2A and 2B, discussed above. The active transducers 250 may be separated using various techniques compatible with semiconductor fabrication processes, such as scribe and break, for example. As stated above, the active transducers 250 may be arranged in a transducer array having one or more rows and columns, in which case the active transducers may not be singulated, but rather may remain in an array configuration on the wafer. In various embodiments, each active transducer 250 in an array may have its own dedicated passivation channel 225, or may share a passivation channel 225 with one or more neighboring active transducers 250.

According to various embodiments, a transducer device having a passivation encapsulated active transducer is more robust than conventional transducer devices. This enables operation of the transducer device in harsher environments, and otherwise increases reliability and operational efficiency of the active transducer in ordinary environments.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A micro-electromechanical systems (MEMS) ultrasonic transducer device, comprising:
a substrate defining an opening;
a first passivation layer formed on the substrate;
an active transducer comprising a plurality of active layers stacked on the first passivation layer over the opening of the substrate; and
a second passivation layer formed on a top surface of the active transducer and side surfaces of the plurality of active layers through a passivation channel surrounding an outer perimeter of the active transducer, wherein the active transducer is completely encapsulated by the first and second passivation layers.

2. The device of claim 1, wherein the second passivation layer abuts the first passivation layer through the passivation channel.

3. The device of claim 2, wherein each of the first and second passivation layers comprises boron silicate glass (BSG).

4. A piezoelectric micro-machined ultrasonic transducer (PMUT) device, comprising:
a first passivation layer formed on a substrate;
a first electrode formed on the first passivation layer;
a piezoelectric layer formed on the first electrode;
a second electrode formed on the piezoelectric layer;
a channel surrounding an active area of the PMUT device, the channel being etched through the first electrode, the piezoelectric layer and the second electrode to the first passivation layer, and exposing corresponding edges of the first electrode, the piezoelectric layer and the second electrode and a portion of the first passivation layer; and
a second passivation layer formed on the second electrode and the channel, the second passivation layer conformally coating the exposed edges of the first electrode, the piezoelectric layer and the second electrode, and the exposed portion of the first passivation layer in the channel to encapsulate the active area of the PMUT device.

5. The device of claim 4, wherein the first and second passivation layers each comprise boron silicate glass (BSG).

6. The device of claim 4, wherein the first and second passivation layers each comprise at least one layer of silicon dioxide ($SiO_2$), silicon nitride (SiN) or polysilicon.

7. The device of claim 5, wherein the first passivation layer has a thickness of about 0.05 µm to about 10 µm, and second passivation layer has a thickness of about 0.05 µm to about 1.0 µm.

8. The device of claim 5, wherein the piezoelectric layer comprises aluminum nitride (AlN) or zinc oxide (ZnO).

9. The device of claim 8, wherein the first and second electrodes each comprise molybdenum (Mo) or tungsten (W).

10. The device of claim 4, wherein the substrate defines an opening to the first passivation layer, the encapsulated active area of the PMUT device being positioned above the opening.

11. A transducer array comprising a plurality of PMUT devices of claim 4.

12. A micro-electromechanical systems (MEMS) ultrasonic transducer device, comprising:
a first passivation layer formed on a substrate;
an active transducer formed on the first passivation layer, the active transducer comprising a plurality of stacked active layers; and
a second passivation layer formed on the active transducer and in a channel surrounding the active transducer, the second passivation layer contacting the first passivation layer within the channel, such that the first and second passivation layers encapsulate the active transducer.

13. The device of claim 12, wherein the active transducer comprises a first electrode, a piezoelectric layer and a second electrode stacked over an opening in the substrate.

14. The device of claim 13, wherein the first and second passivation layers provide protection to side surfaces of the first electrode, the piezoelectric layer and the second electrode of the active transducer.

15. The device of claim 12, wherein the channel comprises an annular channel around the active transducer.

16. The device of claim 12, wherein the first passivation layer has a thickness of about 0.05 µm to about 10 µm, and second passivation layers has a thickness of about 0.05 µm to about 1.0 µm.

17. The device of claim 12, wherein the first and second passivation layers each comprise boron silicate glass (BSG).

18. The device of claim 12, wherein the first and second passivation layers each comprise at least one layer of silicon dioxide ($SiO_2$), silicon nitride (SiN) or polysilicon.

19. The device of claim 12, wherein the second passivation layer has a thickness of about 50 Å to about 500 Å.

20. The device of claim 19, wherein the second passivation layers comprises alumina.

* * * * *